United States Patent [19]
Li et al.

[11] Patent Number: 6,087,696
[45] Date of Patent: Jul. 11, 2000

[54] STACKED TUNNELING DIELECTRIC TECHNOLOGY FOR IMPROVING DATA RETENTION OF EEPROM CELL

[75] Inventors: Xiao-Yu Li, San Jose; Qi Xiang, Santa Clara; Sunil D. Mehta, San Jose, all of Calif.

[73] Assignee: Lattice Semiconductor Corp., Hillsboro, Oreg.

[21] Appl. No.: 09/086,437

[22] Filed: May 28, 1998

[51] Int. Cl.[7] .................................................. H01L 29/788

[52] U.S. Cl. ........................................... 257/321; 257/411

[58] Field of Search ...................................... 257/321, 411

[56] References Cited

U.S. PATENT DOCUMENTS

| | | | |
|---|---|---|---|
| 4,115,914 | 9/1978 | Harari | 257/321 |
| 4,200,474 | 4/1980 | Morris | 257/411 |
| 5,418,388 | 5/1995 | Okudaira et al. | 257/752 |

*Primary Examiner*—Mark V. Prenty
*Attorney, Agent, or Firm*—J. Vincent Tortolano; Davis Chin

[57] ABSTRACT

An improved EEPROM cell structure and a method of fabricating the same is provided so as to improve data retention. The EEPROM cell includes a stacked dielectric structure consisting of a thin tunnel oxide layer and a high-k dielectric layer to function as the tunneling dielectric barrier so as to suppress leakage current.

4 Claims, 5 Drawing Sheets

STACKED TUNNELING DIELECTRIC TECHNOLOGY FOR IMPROVING DATA RETENTION OF EEPROM CELL

BACKGROUND OF THE INVENTION

1. Field of the Invention

This invention relates generally to non-volatile memory devices such as Flash EEPROM cells useful in memory arrays and programmable logic devices (PLDs). More particularly, it relates to an improved EEPROM cell structure and a method for fabricating such EEPROM cell structure so as to improve data retention.

2. Description of the Prior Art

As is generally well-known, an EEPROM cell utilizes a thin tunnel dielectric for electrically erasing and programming the cell. Typically, these EEPROM cells are formed by a plurality of floating gate MOS transistors disposed on a substrate in an integrated circuit. Each of the floating gate MOS transistors includes a pair of source/drain regions formed on a surface of a silicon substrate, a gate oxide film formed on the substrate between the source/drain regions, a thin tunneling dielectric area on the drain region, and a floating gate formed over the gate oxide film, and a stacked control gate disposed over the floating gate.

One of the major concerns is the data retention capability in operating an EEPROM cell based programmable logic device (PLD). As used herein, the term "data retention" is defined to be the length of time a particular EEPROM cell can retain information stored in the form of charges on the floating gate. When electrons traverse the tunnel oxide with no applied gate voltage to the cell, there is created a "low voltage leakage current." This small amount of current leakage will eventually cause a total discharge of the cell. Thus, it is generally desirable to reduce or eliminate the low voltage leakage current.

The low voltage leakage current is dependent upon the quality of the oxide layer. The conventional EEPROM cell uses a single layer of silicon dioxide ($SiO_2$) as the tunneling dielectric whose quality is a function of the amount of charge that can be passed through the dielectric before breakdown of the floating gate occurs. Further, in view of the deep-submicron CMOS technology the device dimensions are being made smaller and smaller. As a result, the oxide layer thickness must be likewise reduced down so as to provide optimal device performance. However, this reduction of the oxide thickness causes its quality to be degraded thereby increasing the leakage current in the cell and reducing its data retention capability.

There have been attempts made heretofore in the prior art of using dielectrics with a dielectric constant "k" that is higher than the silicon dioxide ($SiO_2$) in the MOS transistors as the gate dielectrics and in DRAM cells as the capacitor dielectrics for suppression of leakage current through the dielectric. These types of dielectrics are sometimes referred to as "high-k" dielectrics. Nevertheless, there still exists a need for an EEPROM cell structure and a method for fabricating the same so as to improve data retention.

The EEPROM cell structure of the present invention represents a significant improvement over the traditional EEPROM cell based PLD as previously described. This is achieved in the present invention through the use of a stacked dielectric structure consisting of a thin tunnel oxide layer and a high-k dielectric layer to function as the tunneling dielectric barriers so as to suppress leakage current.

SUMMARY OF THE INVENTION

Accordingly, it is a general object of the present invention to provide an improved EEPROM cell structure and a method for fabricating the same for use in programmable logic devices which overcomes the problems of the prior art.

It is an object of the present invention to provide an EEPROM cell structure which can be fabricated with only minor modifications to the standard EEPROM process.

It is another object of the present invention to provide an improved EEPROM cell structure and a method for fabricating the same which produces improved endurance and data retention characteristics.

It is yet still another object of the present invention to provide an improved EEPROM cell structure which includes a stacked dielectric structure consisting of a thin tunnel oxide layer and a high-k dielectric layer to function as the tunneling dielectric barriers so as to suppress leakage current.

In accordance with a preferred embodiment of the present invention, there is provided a method of fabricating an EEPROM cell so as to improve data retention. An epitaxial layer is formed on a top surface of a semi-conductor substrate. A barrier oxide layer is formed on a top surface of the epitaxial layer. A nitride layer is deposited on a top surface of the barrier oxide layer. Trenches are formed through the epitaxial layer and the barrier oxide layer so as to create isolation regions to electrically isolate active regions in the epitaxial layer from each other. A liner oxide layer is formed on the side walls and bottom of the trenches.

The trenches are filled completely with a TEOS oxide layer. The TEOS layer is removed down to the top surface of the nitride layer. Then, the TEOS oxide layer is planarized and the nitride layer is removed.

A sacrificial oxide layer is formed on the top surface of the epitaxial layer in an area where a program junction implant is to be performed. The program junction implant is formed in the epitaxial layer underneath the sacrificial oxide layer. A photoresist layer is applied over the sacrificial oxide layer to form an opening. The sacrificial oxide layer is etched in the opening down to the top surface of the epitaxial layer. Then, the photoresist layer is removed and a thin tunnel oxide layer is grown in the opening. A high-k dielectric layer is deposited over the thin tunnel oxide layer. A poly-Si layer is deposited over the high-k dielectric layer.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

As previously pointed out, one of the major concerns in the conventional EEPROM cell having a single $SiO_2$ layer as the tunneling dielectric for use as a PLD is the loss of data retention due to the low voltage leakage current caused by the degraded quality of the oxide layer. The purpose of this invention is to provide a method of reducing or eliminating the low voltage leakage current in the oxide layer in the EEPROM cell structure so as to improve data retention. In view of this, the inventors of the instant invention have developed a way of using a stacked dielectric structure which can be added to the conventional EEPROM cell fabrication process in order to achieve this result. Accordingly, the required modifications to the conventional EEPROM cell fabrication process are minimal and therefore do not increase significantly the manufacturing costs.

Figure 1:
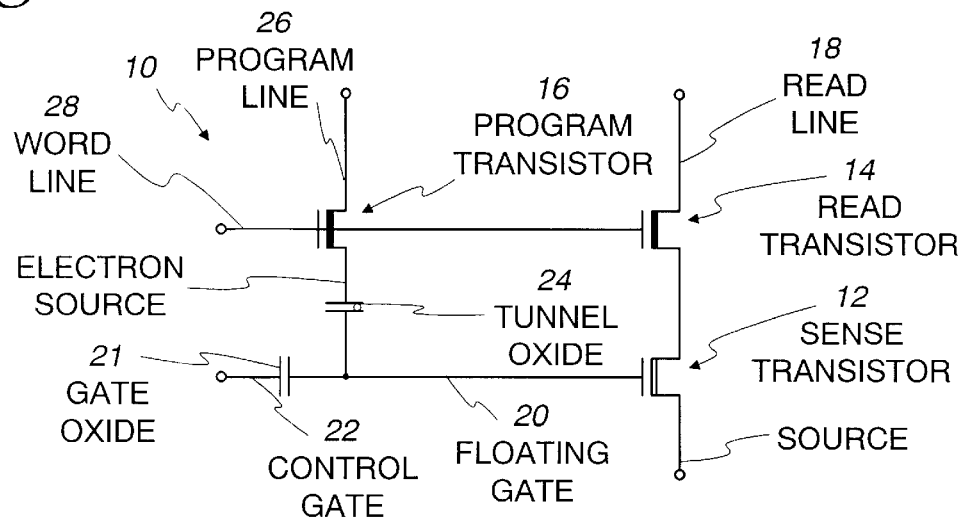
FIG. 1 is a schematic circuit diagram of a conventional EEPROM cell.
Figure 2:
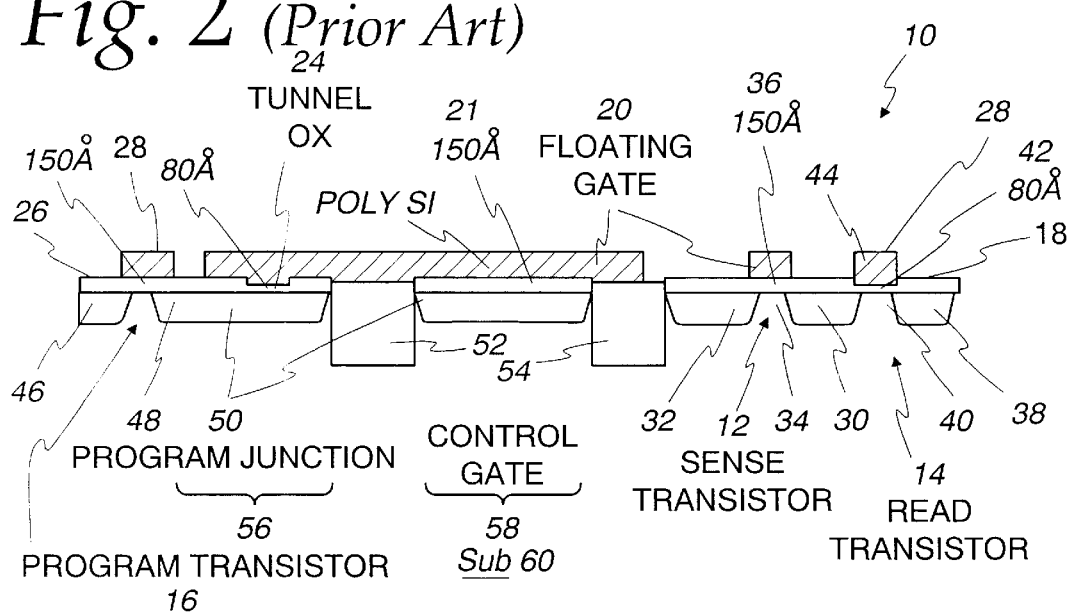
FIG. 2 is a cross-sectional view of the EEPROM cell of FIG. 1 in which a conventional single silicon dioxide layer has been employed as the tunneling dielectric.

Before describing in detail the improved EEPROM cell structure with a stacked dielectric structure of the instant invention, it is believed that it would be helpful in understanding the principles of the present invention and to serve as a background by first explaining the structure of the conventional EEPROM cell with its single $SiO_2$ used as the tunneling dielectric with reference to FIG. 1 through FIG. 3. Therefore, the conventional EEPROM cell structure will now be explained hereinbelow as well as the problems associated therewith.

Initially, there is shown in FIG. 1 a schematic circuit diagram of a conventional EEPROM cell 10. A cross-sectional view of the construction of the EEPROM cell structure 10 is illustrated in FIG. 2. FIGS. 3(a) through 3(m) illustrate in detail the fabrication steps for manufacturing the EEPROM cell structure 10 of FIG. 2.

As can best be seen from FIG. 1, the EEPROM cell is comprised of a floating gate sense transistor 12, a read transistor 14, and a program or write transistor 16. The read transistor has its drain connected to a Read line 18 and its source connected to the drain of the sense transistor 12. The sense transistor has its floating gate 20 capacitively coupled via a gate oxide 21 to a Control Gate line 22 and also capacitively coupled via a tunneling oxide 24 to the source of the program transistor 16. The program transistor 16 has its drain connected to Program line 26 and its gate connected to the gate of the read transistor 14 and to a Word line 28.

With reference to FIG. 2, the EEPROM cell 10 is fabricated with the floating gate sense transistor 12 being formed by an N+ drain region 30 and an N+ source region 32, and a channel region 34 disposed between the drain and source regions. A gate oxide layer (approximately 150 Å in thickness) is formed above the channel, and an N-type polycrystalline silicon (poly-Si) floating gate 20 is formed over the gate oxide 36. The read transistor 14 is formed with an N+ drain region 38 and the N+ source region 30 with a channel region 40 disposed therebetween. A gate oxide layer 42 (approximately 80 Å in thickness) and a gate structure 44 are formed over the channel region 40. The program transistor 16 is formed with an N+ drain region 46, an N+ source region 48, and a programmable junction region 50.

The tunneling oxide layer 24 is formed between the programmable junction region 50 (source or the region 48 of the program transistor 16) and the poly-Si floating gate 20. The gate oxide layer 21 is formed between the floating gate 20 and the control gate line 22. The gate oxide layer 21 is approximately 150 Å in thickness. Areas 52 and 54 define isolation regions in which the shallow trench isolation structures will be located. The shallow trench isolation structures formed in the areas 52 and 54 are used to electrically isolate active regions 56 and 58 of the semiconductor substrate 60 from surrounding devices.

Figure 3A:
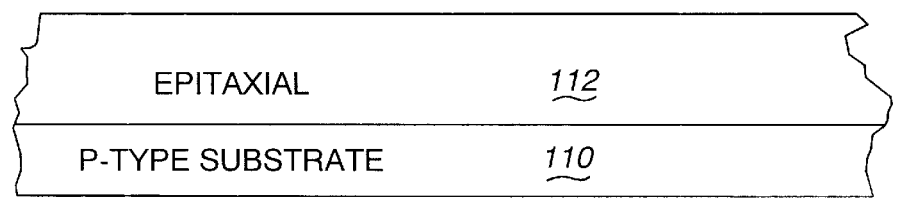
FIGS. 3(a) through 3(m) are cross-sectional views, illustrating the manufacturing steps for fabricating the EEPROM cell of FIG. 1 with a single $SiO_2$ as the tunneling dielectric.
Figure 3B:
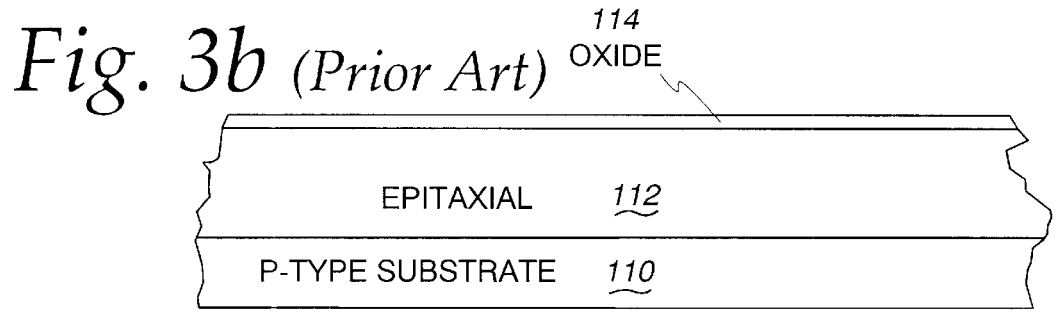
Figure 3C:
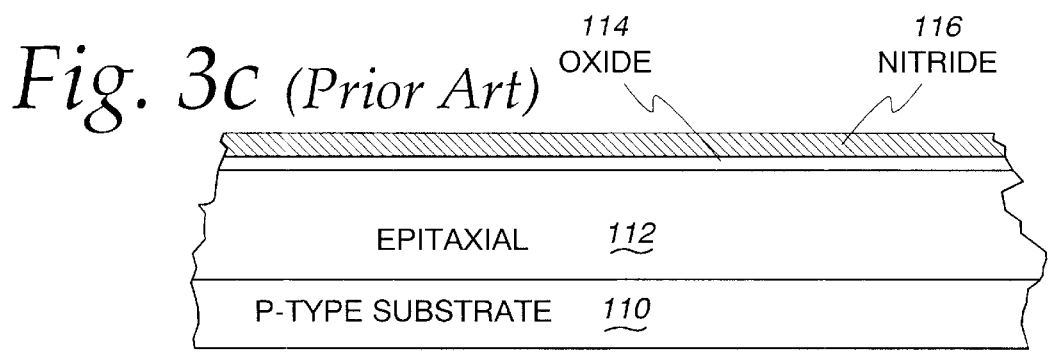

The fabrication steps for manufacturing the conventional EEPROM cell structure 10 of FIG. 2 will now be described in detail with reference to FIGS. 3(a) through 3(m). In FIG. 3(a), there is shown a p-type silicon substrate 110 on top of which is formed an n-type epitaxial (EPI) layer 112. The EPI layer 112 is typically less than 10 μm thick and is preferably about 8 μm. A thin barrier oxide layer 114 is formed on the top surface of the EPI layer 112 to a thickness on the order of 150 Å, as shown in FIG. 3(b). Then, a nitride layer 116 is deposited on top of the barrier oxide layer 114 to a thickness on the order of 1700 Å, as shown in FIG. 3(c).

Figure 3D:
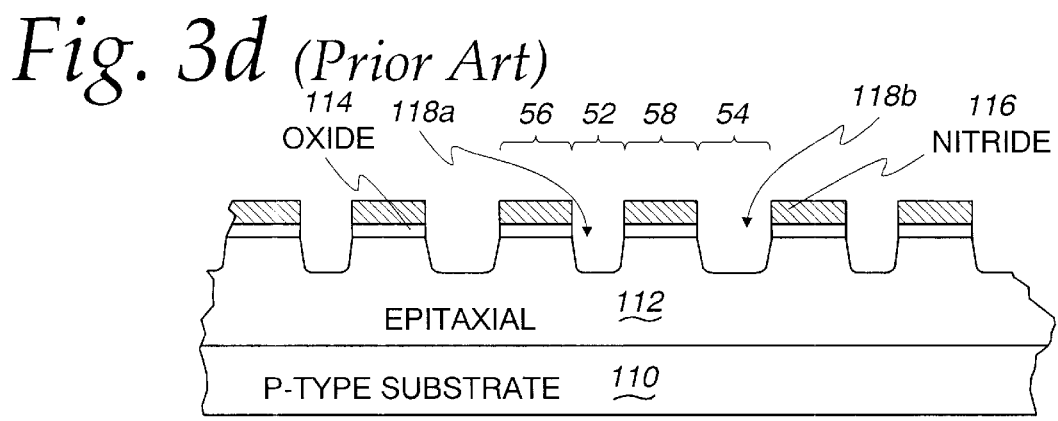

As depicted in FIG. 3(d), the outer surface of the nitride layer and the barrier oxide layer combination is patterned and etched to form trenches 118a, 118b in the respective areas 52, 54 so as to electrically isolate the active regions 56, 58 in the EPI layer 112. Next, after the trenches 118 are formed using an anisotropic etch process, a liner oxide layer 120 is grown on the side walls and bottom of the trenches 118, which serves to prevent carriers from adjacent active devices from traveling therebetween. This is illustrated in FIG. 3(e).

Figure 3E:
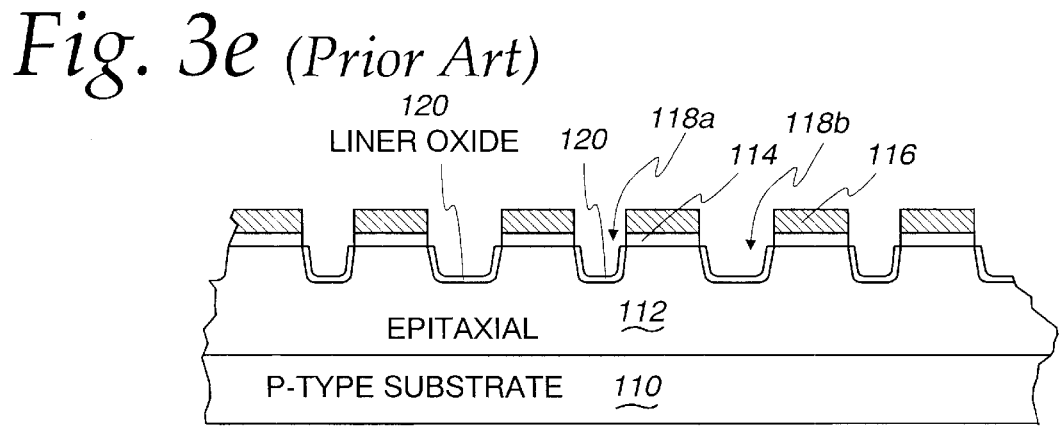
Figure 3F:
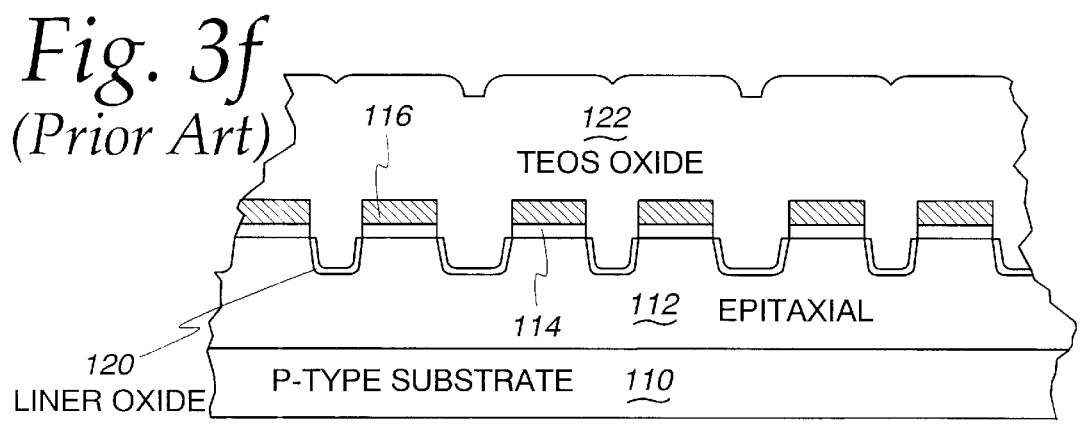
Figure 3G:
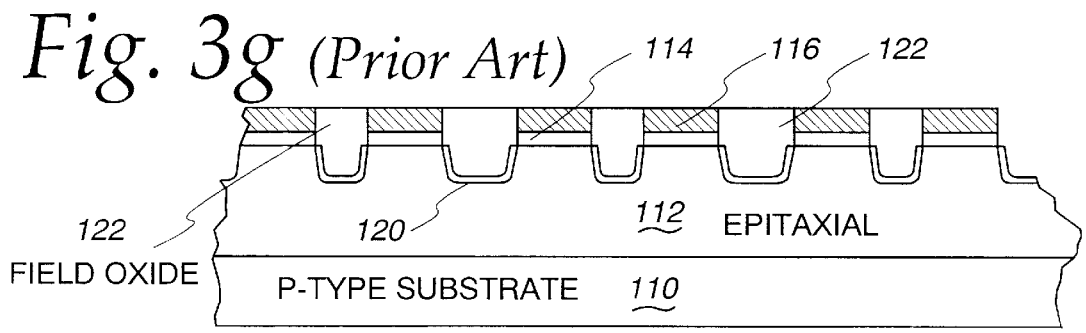

Referring now to FIG. 3(f), a TEOS (tetraethylorthosilicate) oxide layer 122 is deposited over the topography of FIG. 3(e) to fill completely the trenches and up to a thickness of approximately 7200 Å. Then, the TEOS oxide layer is etched until the top surface of the nitride layer 116 is exposed, followed by a chemical-mechanical polishing (CMP) as is known to those skilled in the art for the removal and planarizing of the TEOS oxide layer 122. The resulting structure is depicted in FIG. 3(g).

The following manufacturing steps that will now be described relate specifically to the process of producing the EEPROM cell 10 of FIG. 1 and 2 with a single silicon dioxide ($SiO_2$) layer functioning as the tunneling dielectric. Thus, only the steps to produce the programming junction region 50 and the tunneling oxide layer 24 in the active region 56 will be described in detail. The remaining process techniques to be used to create subsequently the active devices in the active regions, such as channel structures, drain structures, source structures for the transistors 12, 14 and 16 are quite conventional methods and thus will not be described.

Figure 3H:
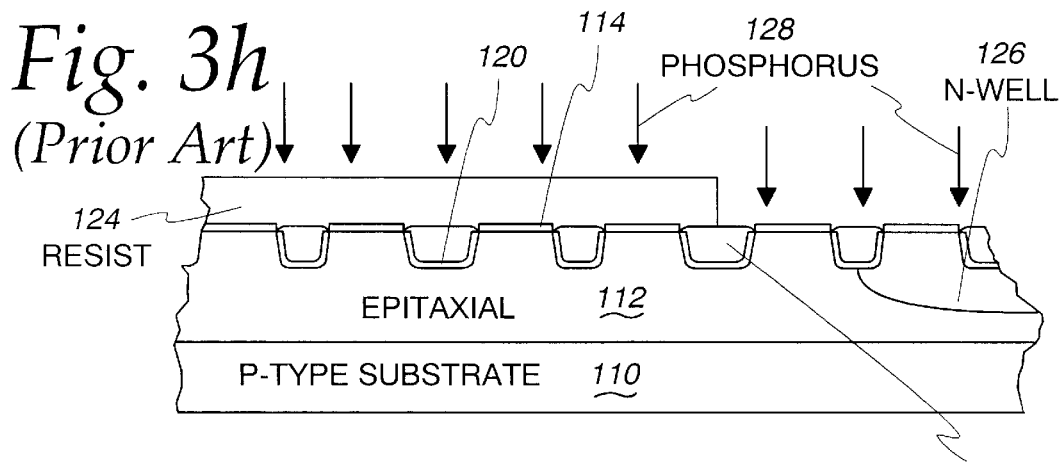

After the polishing step, the nitride layer 116 is stripped away by etching and a photoresist layer 124 is applied to the top surface of the barrier oxide layer 114 and patterned to leave unprotected the area where an N-well implant is to be subsequently performed. The N-well implant region 126 is performed preferably with phosphorous, as indicated by arrows 128. The resulting structure is shown in FIG. 3(h). Next, the photoresist layer 124 is removed using conventional processes. Then, another photoresist layer 134 is applied to the top surface of the barrier oxide layer 114 and is patterned, exposing an opening 132 for a subsequent programming junction (PRJ) implant 134.

Figure 3I:
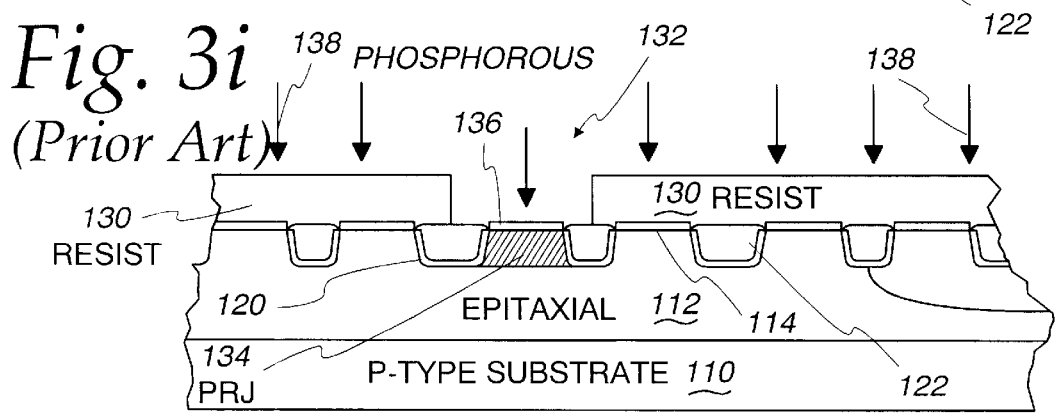

As shown in FIG. 3(i), prior to the PRJ implant 134, a sacrificial oxide layer 136 is grown on the area where the PRJ implant 134 is to be performed. The sacrificial oxide layer is preferably a silicon dioxide grown by a well-known dry oxide process at a temperature of about 900° C. The thickness of the sacrificial oxide layer is approximately 200 Å, which is added to the thickness of the barrier oxide layer 114. The PRJ implant 134 (which is an n-type region serving as a source of electrons) is achieved by phosphorous ions 138 at a dose of about $1 \times 10^{14}$ to $1 \times 10^{16}$ ions/$cm^2$ and an energy of 50–100 KeV. Thereafter, the photoresist layer 130 is removed and a rapid-thermal annealing (RTA) process is performed on the PRJ implant 134 at 800–1000° C. for about 10–30 minutes.

Figure 3J:
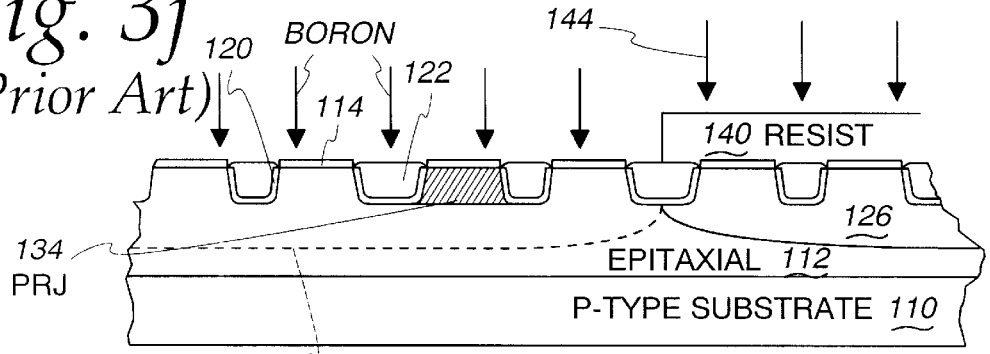
Figure 3K:
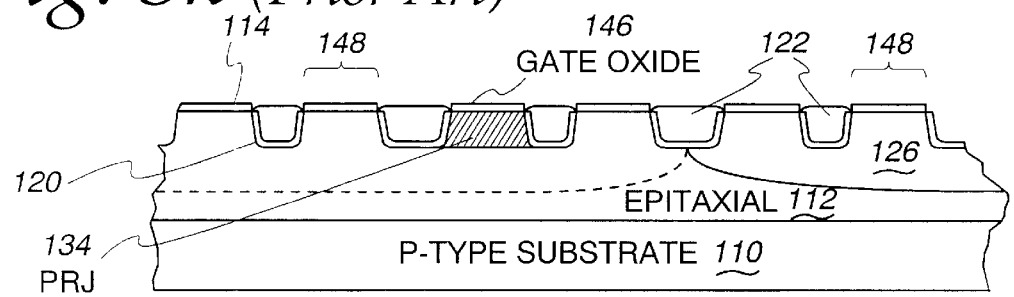

A masking layer 140, such as photoresist, is lithographically patterned as shown in FIG. 3(j) to expose the area where an N-channel field implant 142 is to be subsequently performed. The N-channel field implant is performed preferably with boron 144. Then, the photo-resist layer 140 is removed and a high voltage gate oxide 146 is grown in the areas 148 where high voltage transistors (sense transistor 12 and program transistor 16) are to be later formed. However, prior to the high voltage gate oxide formation, the areas 148 must be "cleaned" which requires the removal of the initial barrier oxide layer 114 and then re-growing of the high voltage gate oxide 146 to a thickness of about 150 Å by thermal oxidation in a dry oxide atmosphere at 800–100° C. This result is shown in FIG. 3(k).

Figure 3L:
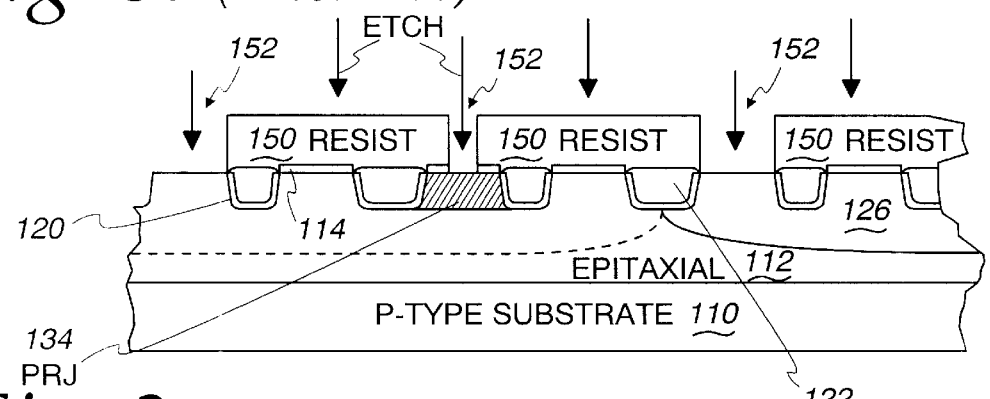

Next, the tunnel oxide 24 which is used in the programming and erasing of the floating gate 20 is established on the surface above a portion of the PRJ implant 134. The desired location for the subsequent tunnel oxide is formed by applying a photoresist layer 150 to the surface of the substrate and patterned to define openings 152. After this, the high voltage gate oxide in the openings 152 are etched down to the top surface of the EPI layer 112. This is illustrated in FIG. 3(l).

Figure 3M:
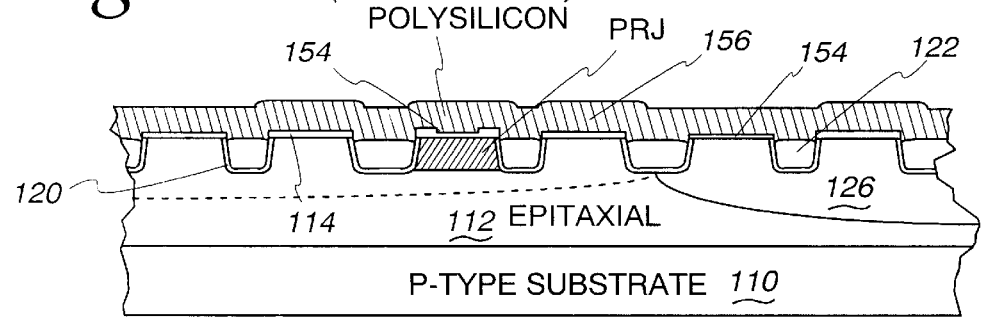

As illustrated in FIG. 3(m), after removal of the photoresist layer 150 thin tunnel oxides 154 are grown to a thickness of approximately 80 Å in the openings 152. These tunnel oxides are grown by thermal oxidation in a dry oxygen atmosphere at 800–1000° C. After completion of the growth of the tunnel oxides 154, the structure is placed in a chemical vapor deposition (CVD) chamber and a polycrystalline silicon (poly-Si) layer 156 is deposited over the entire structure to a thickness of approximately 2000–3000 Å. Then, the poly-Si layer 156 is patterned and etched so as to form the poly floating gate of the sense transistor 12 as well as the gate 28 of the read and program transistors 14, 16, as illustrated in FIG. 2.

Since the thin tunnel oxide layer 154 (corresponding to the tunnel oxide 24 in FIG. 2) is only about 80 Å, it is susceptible to the problem of low voltage leakage current and thus reduces the data retention capability of the EEPROM cell 10. The inventors have developed a simple way of providing a stacked dielectric structure functioning as the tunneling dielectric barriers so as to prevent leakage current from occurring. This is achieved very economically by a stacked dielectric structure, which does not require the use of additional equipment and can be performed with only minimal modifications to the existing fabrication process for forming the conventional EEPROM cell 10.

Figure 4A:
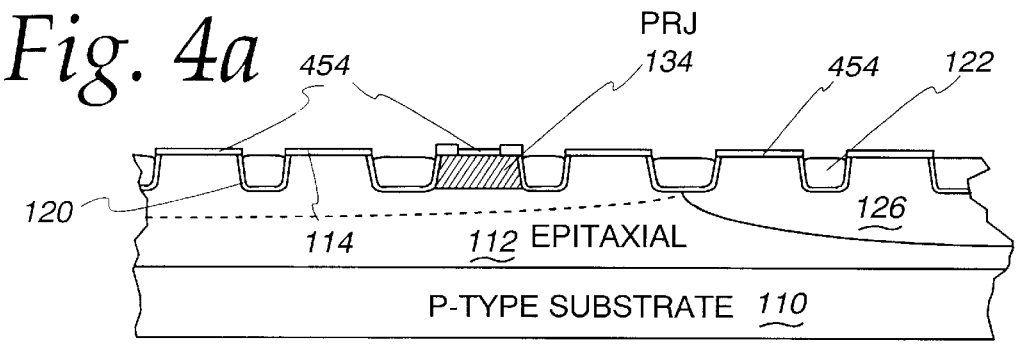
FIGS. 4(a) though 4(c) are cross-sectional views fabrication steps for forming the stacked dielectric structure in the EEPROM cell, constructed in accordance with the principles of the present invention.
Figure 4B:
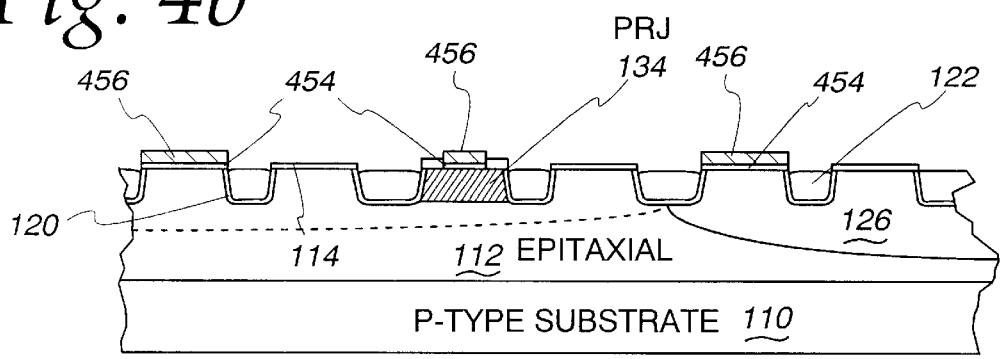
Figure 4C:
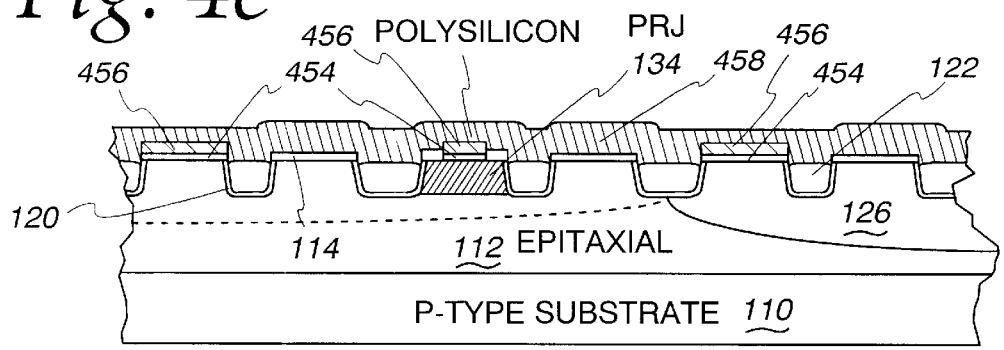

Referring now to FIGS. 4(a)–4(c) of the drawings, there are illustrated the process steps for forming the stacked dielectric structure which are implemented in accordance with the teachings of the present invention. The process steps for forming the stacked dielectric structure are performed immediately after the etching of the gate oxide in the openings 152 down to the top surface of the EPI layer 112, as illustrated in FIG. 3(j) of the conventional EEPROM cell fabrication process.

As shown in FIG. 4(a), after the photoresist layer 150 has been removed thin tunnel oxides 454 are grown to a thickness of approximately 60 Å in the openings 152 rather than the 80 Å thickness as in the conventional EEPROM cell of FIG. 3(m) using the single $SiO_2$ tunnel oxide layer 154. These tunnel oxides 454 are grown by thermal oxidation in a dry oxygen atmosphere at 800–1000° C.

Next, as illustrated in FIG. 4(b), after completion of the growth of the tunnel oxides 454 a high-k dielectric layer 456 of a predetermined thickness is deposited over the tunnel oxide 454 using a chemical vapor deposition (CVD) method. The high-k dielectric layer 456 is preferably made of tantalum oxide ($Ta_2O_5$). However, other high-k dielectric materials may be used similar to the ones shown in the Table listed below.

Thereafter, a polycrystalline (poly-Si) layer 456 is deposited over the entire structure to a thickness of approximately 2000–3000 Å. This is depicted in FIG. 4(c). Next, the poly-Si layer 458 is patterned and etched so as to form the floating gate 20 of the sense transistor 12 as well as the gates 28 of the read and program transistors 14 and 16 of FIG. 2.

If $Ta_2O_5$ (amorphous) is used, which has a k value of approximately 25 and is about 6 times higher than $SiO_2$ (with a k value of 3.9), then the thickness of the dielectric layer 456 will be made to be approximately 120 Å. This thickness is selected so that when combined with the thinner $SiO_2$ layer 454, the total capacitance will be substantially the same as the single $SiO_2$ layer 154. As can be seen, there is shown in the Table the different k values for the various dielectric materials and the corresponding thicknesses to be used when the $SiO_2$ layer 454 has a 60 Å thickness. It will be noted that the thickness of the dielectric material having a higher k value must be made proportionally larger in order to maintain the same overall total capacitance.

TABLE

| Dielectric Material | Value of k | Thickness of Layer |
| --- | --- | --- |
| Tantalum Oxide (amorphous) $Ta_2O_5$ | ≈25 | 120 Å |
| Tantalum Oxide (crystalline) $Ta_2O_5$ | ≈80 | 360 Å |
| Titanium Oxide (crystalline) $TiO_2$ | ≈30 | 140 Å |
| Titanium Oxide (amorphous) $TiO_2$ | ≈120 | 570 Å |
| Aluminum Oxide $Al_2O_3$ | ≈10 | 48 Å |
| Silicon Nitride $Si_3N_4$ | ≈7.8 | 38 Å |

The stacked dielectric structure consisting of the $SiO_2$ layer 454 and the high-k dielectric layer 456 functions as a tunneling dielectric barrier so as to suppress leakage current during a Read operation. Consequently, the improved EEPROM cell of the present invention will have enhanced data retention.

Figure 5:
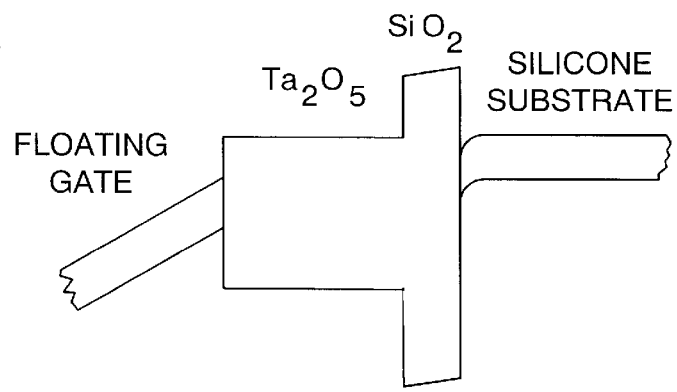
FIG. 5 is a diagram, illustrating the variations of respective energy bands in the substrate, silicon dioxide layer, high-k dielectric layer, and the floating gate.

In FIG. 5, there is provided a diagram which illustrates the variation of respective energy bands possessed by a Si substrate, a $SiO_2$ layer, a high-k $Ta_2O_5$ layer, and a floating gate before a Fowler-Norheim tunneling of electrons from a channel region to the floating gate through the $SiO_2$ layer and the $Ta_2O_5$ layer. Since the electrons in the substrate must pass through both the barriers in the $SiO_2$ layer and the $Ta_2O_5$ layer, there will be a suppression of the leakage current and thus improving the data retention.

From the foregoing detailed description, it can thus be seen that the present invention provides an improved EEPROM cell structure and a method for fabricating the same so as to improve data retention. The EEPROM cell includes a stacked dielectric structure consisting of a thin tunnel oxide layer and a high-k dielectric layer to function as the tunneling dielectric barriers so as to suppress leakage current.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An improved EEPROM cell structure having enhanced data retention characteristics, comprising:

a semiconductor substrate;

an epitaxial layer formed on a top surface of said semiconductor substrate;

a barrier oxide layer formed on a top surface of said epitaxial layer;

a nitride layer deposited on a top surface of said barrier oxide layer;

trenches formed through said epitaxial layer and said barrier oxide layer so as to create isolation regions in order to electrically isolate active regions in said epitaxial layer;

a liner oxide layer formed on side walls and bottom of said trenches;

said trenches being filled completely with a TEOS oxide layer;

said TEOS layer being removed down to the top surface of said nitride layer;

said TEOS oxide layer being planarized;

said nitride layer being removed;

a sacrificial oxide layer formed on the top surface of said epitaxial layer in an area where a programmable junction implant is to be performed;

said programmable junction implant being formed in said epitaxial layer underneath said sacrificial oxide layer;

said sacrificial oxide layer having an opening formed therein down to the top surface of said epitaxial layer;

a thin tunnel oxide layer formed in said opening;

said thin tunnel oxide layer being formed of $SiO_2$ with a thickness of approximately 60 Å;

a high-k dielectric layer being disposed over said thin tunnel oxide layer;

said high-k dielectric layer being formed of $Al_2O_3$ and having a thickness of approximately 50 Å; and a poly-Si layer being deposited over said high-k dielectric layer.

2. An improved EEPROM cell structure as claimed in claim 1, wherein said thin tunnel oxide layer and said high-k dielectric layer define a stacked dielectric structure functioning as a tunneling dielectric barrier so as to suppress leakage current.

3. An improved EEPROM cell structure as claimed in claim 1, wherein said high-k dielectric layer is deposited by using a CVD process.

4. An improved EEPROM cell structure having enhanced data retention characteristics, comprising:

a semiconductor substrate;

an epitaxial layer formed on a top surface of said semiconductor substrate;

a barrier oxide layer formed on a top surface of said epitaxial layer;

a nitride layer deposited on a top surface of said barrier oxide layer;

trenches formed through said epitaxial layer and said barrier oxide layer so as to create isolation regions in order to electrically isolate active regions in said epitaxial layer;

a liner oxide layer formed on side walls and bottom of said trenches;

said trenches being filled completely with a TEOS oxide layer;

said TEOS layer being removed down to the top surface of said nitride layer;

said TEOS oxide layer being planarized;

said nitride layer being removed;

a sacrificial oxide layer formed on the top surface of said epitaxial layer in an area where a programmable junction implant is to be performed;

said programmable junction implant being formed in said epitaxial layer underneath said sacrificial oxide layer;

said sacrificial oxide layer having an opening formed therein down to the top surface of said epitaxial layer;

a thin tunnel oxide layer formed in said opening;

said thin tunnel oxide layer being formed of $SiO_2$ with a thickness of approximately 60 Å;

a high-k dielectric layer being disposed over said thin tunnel oxide layer;

said high-k dielectric layer being formed of $Si_3N_4$ and having a thickness of approximately 40 Å; and a poly-Si layer being deposited over said high-k dielectric layer.

* * * * *